United States Patent
Lee et al.

(10) Patent No.: US 7,160,780 B2
(45) Date of Patent: Jan. 9, 2007

(54) METHOD OF MANUFACTURING A FIN FIELD EFFECT TRANSISTOR

(75) Inventors: Chul Lee, Seoul (KR); Jae-Man Yoon, Seoul (KR); Choong-Ho Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/066,703

(22) Filed: Feb. 23, 2005

(65) Prior Publication Data

US 2005/0186746 A1 Aug. 25, 2005

(30) Foreign Application Priority Data

Feb. 23, 2004 (KR) .................... 10-2004-0011782

(51) Int. Cl.
*H01L 21/336* (2006.01)
(52) U.S. Cl. ................ 438/283; 438/284; 257/E21.178
(58) Field of Classification Search ................ 438/283, 438/284; 257/E21.178
See application file for complete search history.

(56) References Cited

U.S. PATENT DOCUMENTS

| | | | |
|---|---|---|---|
| 4,996,574 A | 2/1991 | Shirasaki et al. | |
| 6,300,182 B1 | 10/2001 | Yu | |
| 6,635,923 B1 | 10/2003 | Hanafi et al. | |
| 6,642,090 B1 * | 11/2003 | Fried et al. | 438/164 |
| 2001/0020724 A1 * | 9/2001 | Berry et al. | 257/397 |
| 2002/0011612 A1 * | 1/2002 | Hieda | 257/262 |
| 2003/0178677 A1 | 9/2003 | Clark et al. | |
| 2005/0035415 A1 * | 2/2005 | Yeo et al. | 257/401 |
| 2005/0056892 A1 * | 3/2005 | Seliskar | 257/348 |

* cited by examiner

*Primary Examiner*—Trung Dang
(74) *Attorney, Agent, or Firm*—Marger Johnson & McCollom, P.C.

(57) ABSTRACT

In an exemplary embodiment, a fin active region is protruded along one direction from a bulk silicon substrate on which a shallow trench insulator is entirely formed so as to cover the fin active region. The shallow trench insulator is removed to selectively expose an upper part and sidewall of the fin active region, along a line shape that at least one time crosses with the fin active region, thus forming a trench. The fin active region is exposed by the trench and thereon a gate insulation layer is formed. Thereby, productivity is increased and performance of the device is improved. A fin FET employs a bulk silicon substrate of which a manufacturing cost is lower than that of a conventional SOI type silicon substrate. Also, a floating body effect can be prevented, or is substantially reduced.

26 Claims, 5 Drawing Sheets

METHOD OF MANUFACTURING A FIN FIELD EFFECT TRANSISTOR

CROSS REFERENCE TO RELATED APPLICATIONS

This application claims priority from Korean Patent Application No. 2004-11782, filed on Feb. 23, 2004, the contents of which are hereby incorporated by reference for all purposes.

BACKGROUND OF THE INVENTION

1. Field of the Invention

This disclosure relates to semiconductor devices, and more particularly, to a method of manufacturing a fin field effect transistor.

2. Description of the Related Art

Recent rapid development in the information and communication field, and a popularization of information media such as computers, have brought about a rapid progress of semiconductor devices. A high-integration of semiconductor devices has brought about research activity for various methods of reducing a feature size of individual devices formed on a substrate while increasing performance of the devices.

In such methods a field effect transistor (FET) is increasingly used to improve integration of devices based on a silicon semiconductor technique and a CMOS (Complementary Metal Oxide Semiconductor) technique, which have a prominent production presence. A scaling-down of a general planar field effect transistor in conformity with the high-integration of the devices results in a lowered performance or reliability of the devices. Thus three-dimensional structures, such as a vertical transistor, have been proposed instead of a planar type structure.

As an example of these structures, a fin field effect transistor (fin FET) has been proposed. The fin FET has a characteristic vertical structure of a transistor body that resembles a fin shape like a fish dorsal, which is disclosed in U.S. Pat. No. 4,996,574 or 6,635,923, etc. A conventional fin FET employs an SOI (Silicon On Insulator) type silicon substrate where a general silicon substrate and a single crystal silicon layer, or a single crystal silicon film having a predetermined thickness, are bonded with each other, with an interposed insulation layer such as silicon oxide. The conventional fin FET is formed in such a way that a channel formation fin active region is vertically protruded with a predetermined height and line width on the insulation layer. Also, a gate electrode obtained by forming a gate insulation layer on a surface of the fin active region is formed crossing the fin active region and surrounding it. A sectional face of the fin active region protruded from the insulation layer becomes a width of channel, and a line width of the gate electrode crossing the fin active region becomes a length of channel. Such a fin FET, according to a conventional technique, can use an entire face of protruded portions as channels, thus having a remarkably increased channel width effect as compared with a conventional planar fin FET. Since a channel length is not reduced in a fin FET, according to a conventional technique, by a scaling-down of a device formation region as compared with a general transistor, a narrow channel effect caused by a channel width reduction can be prevented. To reduce a width of protruded portion, a channel depletion layer formed in the gate region may be partially depleted or fully depleted. There is thus a channel conduction increase effect.

However, a fin FET manufacturing method according to a conventional technique has the following problems.

First, production costs of the SOI type silicon substrate is high, which results in increased manufacturing costs of the device with decreased productivity. This is the case of using an SOI type silicon substrate in which an insulation layer is formed between a bottom silicon substrate and a silicon layer when forming a fin FET on an insulation layer.

Second, performance of the device falls by a floating body effect caused in a triple gate fin FET manufacturing method using an SOI type silicon substrate according to a conventional technique. This is because a transistor body is not connected with a substrate by a characteristic aspect of the device formed on the SOI type silicon substrate, thus an electron-hole pair is concentrated on a surface near an insulation layer when a channel is formed on the body.

Third, for an SOI type silicon substrate it is difficult to control the height of an interlayer dielectric or a shallow trench insulator for partially exposing the fin active region. Clearly, it is advantageous to use bulk silicon substrate instead of an SOI type silicon substrate to form a fin active region.

SUMMARY OF THE INVENTION

Some embodiments of the invention provide a method of manufacturing a fin field effect transistor (fin FET), which is capable of increasing productivity by substantially reducing a manufacturing cost, without using an SOI type substrate that becomes a factor of high production cost.

Other embodiments of the invention provide a fin FET and a method of manufacturing a fin FET, which are capable of preventing a floating body effect, thereby increasing performance of the device. Further, a height of a fin active region exposed by a shallow trench insulator or interlayer dielectric is controlled, thus increasing performance of the device.

BRIEF DESCRIPTION OF THE DRAWINGS

The above and other features of exemplary embodiments of the invention will become readily apparent from the description that follows, with reference to the attached drawings.

DETAILED DESCRIPTION OF THE INVENTION

Exemplary embodiments of the invention are more fully described in detail with reference to the accompanying drawings. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art.

Figure 1:
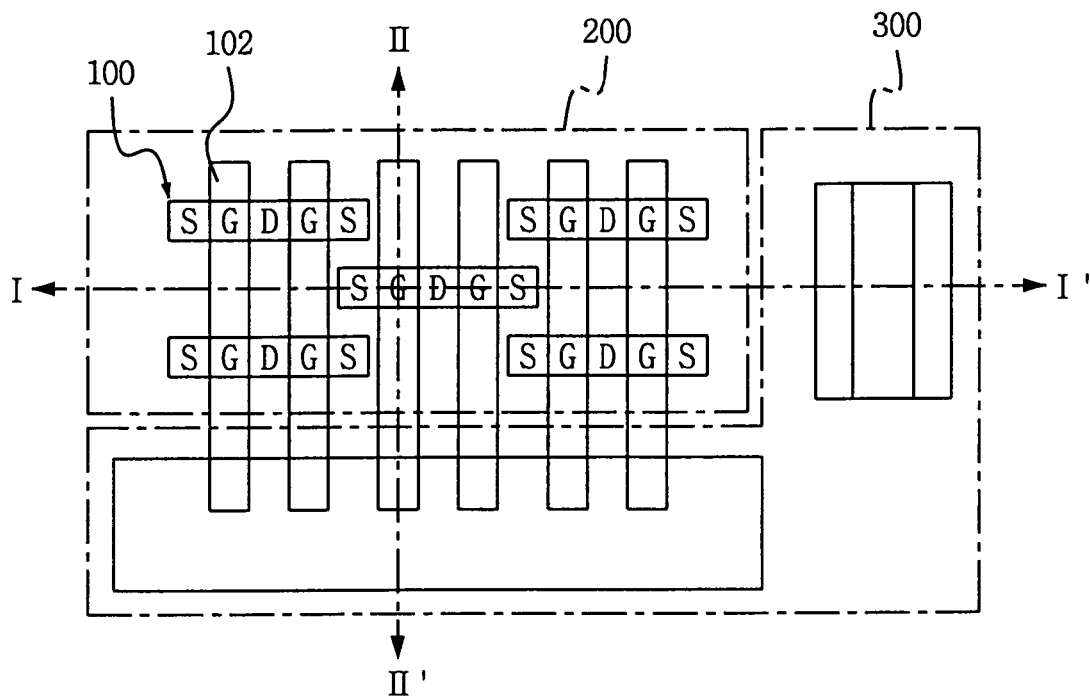
FIG. 1 is a plan view schematically illustrating a fin FET according to an exemplary embodiment of the invention.

FIG. 1 is a plan view schematically illustrating a fin FET according to an exemplary embodiment of the invention.

Referring to FIG. 1, a fin FET (Fin Field Effect Transistor) according to an exemplary embodiment of the invention is constructed of a fin active region 100 protruded from a bulk silicon substrate (110 of FIG. 2a) and arranged in one direction, and a gate line 102 crossing the fin active region 100. The fin active region 100 is constructed of a source region S and a drain region D provided on both sides thereof, centering on a gate region G crossing the gate line 102. If a fin FET is used as a device for controlling an input and output of a memory device such as a DRAM (Dynamic Random Access Memory), the gate line 102 becomes a word line to which a gate signal is inputted and outputted, where the gate signal controls an input/output of data or charge applied to a cell capacitor. Though not shown in the drawing, a bit line crossing with the word line is formed in a parallel direction with the fin active region 100, and a cell capacitor for storing data or charge through the transistor is formed in an upper or lower part of the transistor. The fin FET is positioned in a cell region 200 where the fin active region 100 is formed, and a planar field effect transistor is positioned in a peripheral region 300 of the cell region, to input and output a data signal and control signal to the word line and bit line.

A method of manufacturing a fin FET will be described as follows.

FIGS. 2a to 2i are sectional views illustrating sequential processes of manufacturing a transistor, taken along lines I~I' and II~II' of FIG. 1.

Figure 2A:
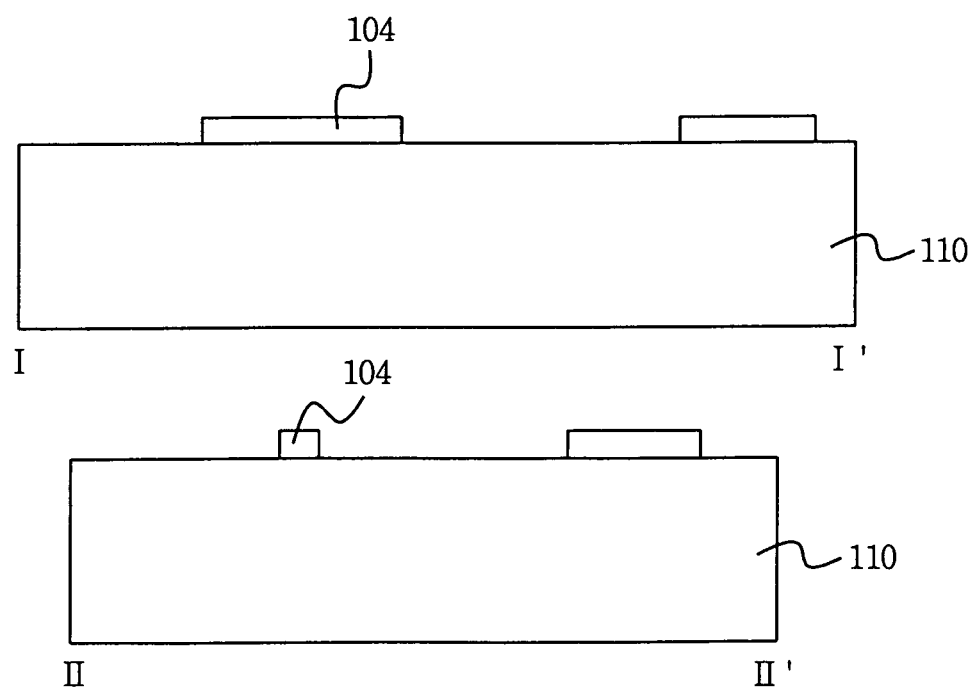
FIGS. 2a to 2i are sectional views illustrating sequential processes of manufacturing a transistor, taken along lines I~I' and II~II' of FIG. 1.

With reference to FIG. 2a, a first hard mask layer 104 having a predetermined thickness is formed on a bulk silicon substrate 110 by a chemical vapor deposition (CVD), and is then patterned by a general photolithography and etching process. The first hard mask layer 104 is formed of silicon nitride or silicon oxide nitride. If the first hard mask layer 104 is formed of silicon oxide nitride, an antireflective layer is formed on the silicon oxide nitride layer and is then patterned by a photolithography and etching process. Though not shown in the drawing, if an etching stop layer having a predetermined thickness is further formed of a silicon oxide layer between the bulk silicon substrate 110 and the first hard mask layer 104, and then the first hard mask layer 104 is removed, a profile can be improved. For example, the etching stop layer is formed with a thickness of about 100 Å to about 500 Å on the bulk silicon substrate 110, and the first hard mask layer 104 is formed with a thickness of about 500 Å to about 2000 Å. Then, in the photolithography and etching process, to prevent a diffused reflection in an exposure procedure of photoresist formed on the first hard mask layer 104, an antireflective layer having a predetermined thickness may be formed on the first hard mask layer 104. Further, in the photolithography and etching process, the first hard mask layer 104 may be patterned by a dry etching, and reactive gas used in the dry etching may be prominent to a selective etch rate of the first hard mask layer 104 as compared with that of the etching stop layer or bulk silicon substrate 110. Thus, according to an exemplary embodiment of the invention, an etching stop layer and a first hard mask layer 104 may be added on the bulk silicon substrate 110, and the first hard mask layer 104 may be patterned by a general photolithography and etching.

Figure 2B:
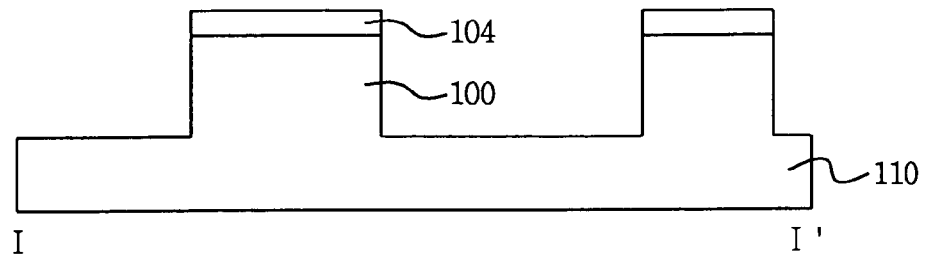
Figure 2B:
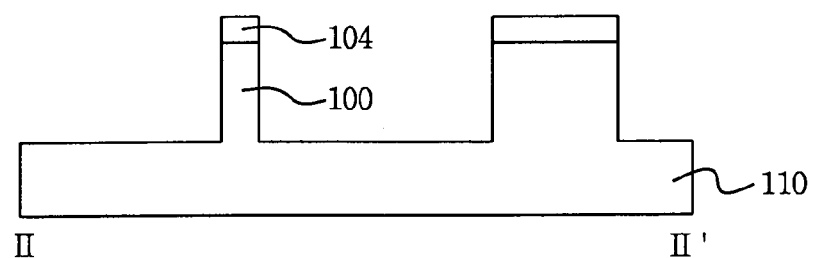

As shown in FIG. 2b, the etching stop layer and the bulk silicon substrate 110 are etched to a predetermined depth by using the first hard mask layer 104 as an etch mask, to form a fin active region 100 having a predetermined height from a lower layer surface of the bulk silicon substrate 110 under the first hard mask layer 104. The etching of the bulk silicon substrate 110 employs a dry etching method having a prominent vertical etch characteristic. A time etching method is used so that the fin active region 100 is protruded with a predetermined height by removing, to a given depth, the bulk silicon substrate 110 for a predetermined time. That is, the bulk silicon substrate 110 is removed from a surface thereof to a predetermined depth so that a protruded fin active region 100 is formed. A lower part of the bulk silicon substrate 110 is defined as a bulk silicon substrate.

Hence, the fin active region 100 is formed to have a height over about 1500 Å from a surface of the bulk silicon substrate 110.

Figure 2C:
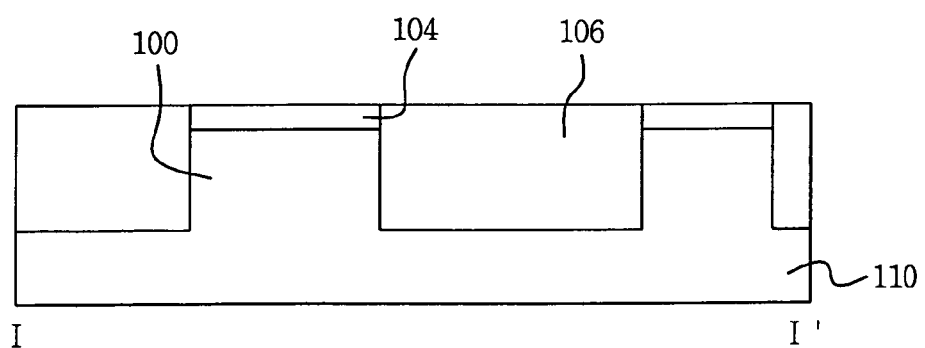
Figure 2C:
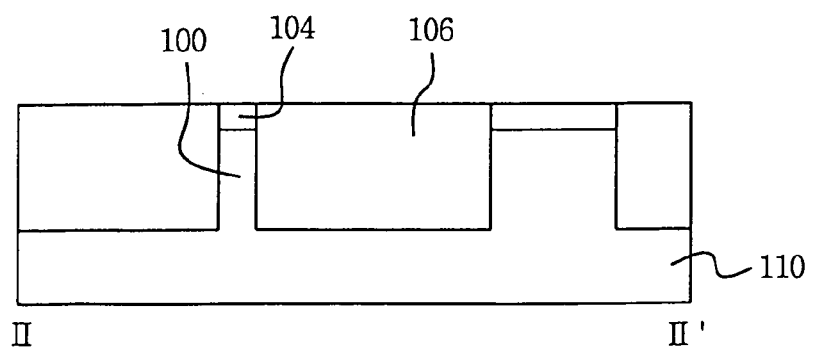

With reference to FIG. 2c, a shallow trench insulator (STI) 106 or interlayer dielectric (ILD) is formed of silicon oxide entirely on the bulk silicon substrate 110 where the fin active region 100 is formed, by a chemical vapor deposition (CVD). Then the shallow trench insulator 106 is removed and planarized by a chemical mechanical polishing (CMP), to expose the first hard mask layer 104. The shallow trench insulator 106 is formed with a thickness of about 3000 Å to about 8000 Å, to entirely cover the fin active region and to be higher than a height of the fin active region 100, between the plurality of fin active regions 100, and is formed in such a way that the first hard mask layer 104 is exposed and planarized by the CMP. Though not shown in the drawing, a silicon oxide layer and a silicon nitride layer are sequentially accumulated entirely on the fin active region 100 and the bulk silicon substrate 110, before forming the shallow trench insulator 106; and a liner layer may be formed to protect a surface of the bulk silicon substrate 110 and the fin active region 100 of silicon material exposed in air. The liner layer serves to protect a sidewall of the fin active region 100 near the gate line 102 in case the shallow trench insulator 106 is removed later to form a gate electrode.

Figure 2D:
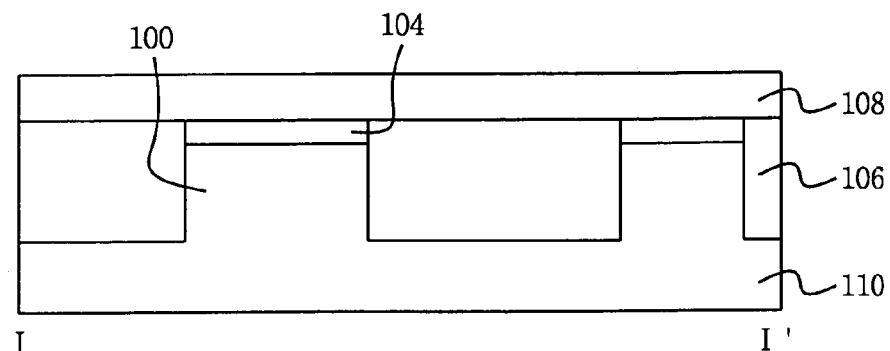
Figure 2D:
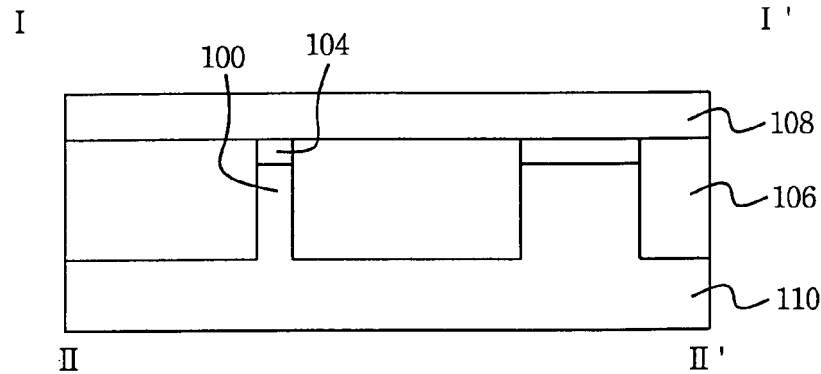

With reference to FIG. 2d, a second hard mask layer 108 is formed of polysilicon or silicon nitride on the bulk silicon substrate 110 where the shallow trench insulator 106 was formed, by a CVD. The second hard mask layer 108 may be used in removing portions of the shallow trench insulator 106, thus defining a cell region 200 and a peripheral region 300. A thickness of the second hard mask layer 108 may be controlled in conformity with a depth of trench or groove formed by removing the shallow trench insulation 106. For example, in the embodiment, the second hard mask layer 108 is formed to have a thickness under about 1500 Å.

Figure 2E:
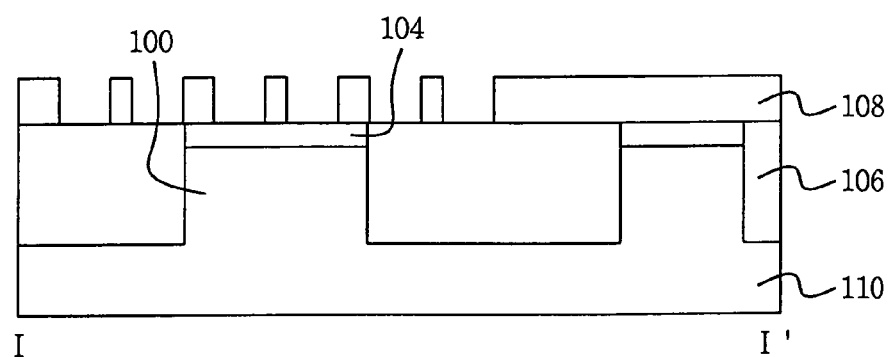
Figure 2E:
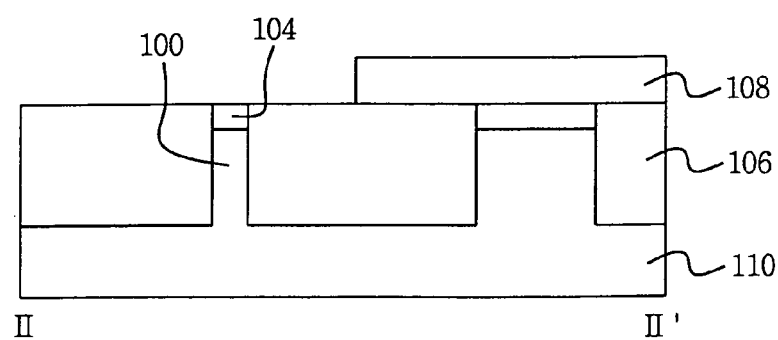

Referring to FIG. 2e, the second hard mask layer 108 is patterned by a general photolithography and etching method. The second hard mask layer 108 is patterned to entirely cover a peripheral region 300 and to selectively expose the shallow trench insulator 106 or first hard mask layer 104, which corresponds to portions where a gate electrode (116 of FIG. 2i) and a gate line 102 will be formed in a cell region 200. The second hard mask layer 108 is removed by a line width larger than the gate electrode 116 and the gate line 102, then the line width of the gate electrode and gate line 102 is defined by a first spacer (112 of FIG. 2f) formed in a sidewall of the second hard mask layer 108.

Figure 2F:
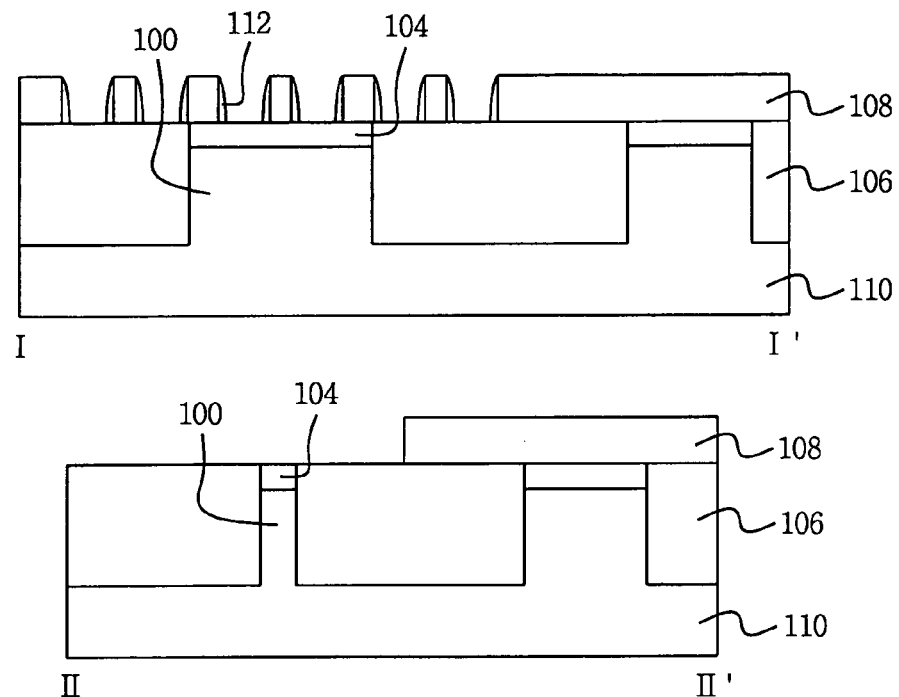

As shown in FIG. 2f, a polysilicon or silicon nitride layer having a predetermined thickness is formed entirely on the first hard mask layer 104 and the shallow trench insulator 106, exposed by the first hard mask layer 104, and is then removed to expose the shallow trench insulation 106 and the first hard mask layer 104 by a dry etching, thus forming a first spacer 112 in a sidewall of the second hard mask layer 108. The first spacer 112 is formed by a mutually exclusive use of a polysilicon layer or a silicon nitride layer that is used for the second hard mask layer 108. That is, in case the second hard mask layer 108 is formed of a polysilicon layer, the first spacer 112 may be formed of the silicon nitride layer. In case the second hard mask layer 108 is formed of silicon nitride layer, the first spacer 112 may be formed of the polysilicon layer. The first spacer 112 is formed on a sidewall of the second hard mask layer 108, so that a step coverage is prominent. The polysilicon or silicon nitride layer may be formed on a horizontal upper surface of the hard mask layer 108, and even if the insulation layer is removed from the upper surface by using vertical and anisotropic dry etching, it is only partially removed from the sidewall of the second hard mask layer 108.

Figure 2G:
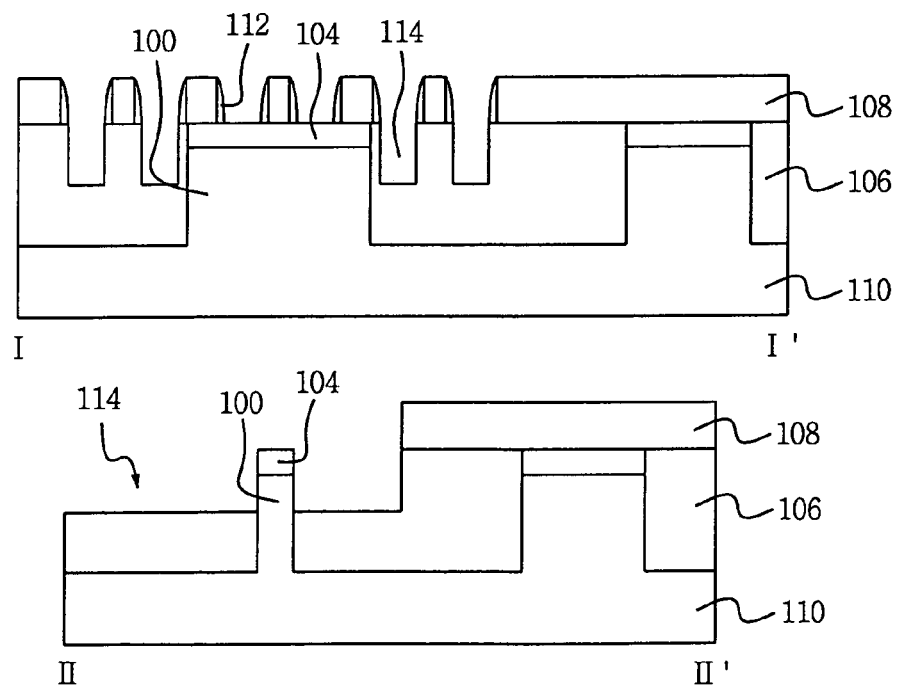

As shown in FIG. 2g, the shallow trench insulator 106 is removed to a predetermined depth by a dry etching of a self-align method in which the first spacer 112 and the second hard mask layer 108 are used as an etch mask, to thus form a trench 114 or groove. A depth of the trench 114 or groove is controlled by time-etching the shallow trench insulator 106 by using a reactive gas having a given etch rate for the shallow trench insulation 106; or may be controlled by an EPD (Etch Point Detection) method in which the first hard mask layer 104 or the shallow trench insulator 106 is exposed after the second hard mask layer 108 is all removed with a given etch rate at the same time as an etching of the shallow trench insulator 106.

In forming the trench 114 or groove by the dry etching, the shallow trench insulator 106 can be selectively removed by reactive gas of the dry etching, but the fin active region 100 is protected vertically by the first hard mask layer 104. The trench 114 or groove selectively exposes a sidewall of the fin active region 100 in a gate region G.

For example, the trench 114 or groove is formed to have a depth of about 200 Å to 800 Å from a top surface of the fin active region 100 to a lower part thereof. In case the second hard mask layer 108 is formed of a polysilicon layer, an etch rate of the second hard mask layer 108 by reactive gas of dry etching is similar to an etch rate of the shallow trench insulator 106, thus the second hard mask layer 108 is removed at the same time as a formation of the trench 114 or groove, when forming the trench 114 or groove with a removal of the shallow trench insulator 106. In case the second hard mask layer 108 is formed of a silicon nitride layer, the second hard mask layer 108 can be removed when forming the trench 114 or groove, by controlling its thickness by its etch rate in forming the trench 114 or groove may have some difference from an etch rate of the shallow trench insulator 106. The first spacer 112 is also removed simultaneously to the removal of the second hard mask layer 108. Hence, the second hard mask layer 108 is formed having a thickness based on a predetermined depth of the trench 114 or groove, and the second hard mask layer 108 and the first spacer 112 can be removed simultaneously to a form the trench 114 or groove.

That is, a manufacturing method of a fin FET, according to an exemplary embodiment of the invention, employs a time etching method, or EPD method, removing, to a predetermined depth, the shallow trench insulator 106, thus forming a trench 114 or groove. A height of the fin active region 100, which is exposed from the shallow trench insulator 106 by the trench 114 or groove, can be controlled. Then a gate electrode (116 of FIG. 2i) can be formed reproducibly in a gate region of the fin active region 100, thereby improving performance of the device.

The shallow trench insulator 106 remaining in a sidewall of the fin active region 100 of source region S and drain region D is used later to form a gate electrode (116 of FIG. 2i) by a damascene method.

Further, in forming the trench 114 or groove with a selective removal of the shallow trench insulator 106 of silicon oxide layer material, a liner of silicon nitride layer material formed on a surface of the fin active region 100 protects the fin active region 100, so that a sidewall or top surface of the fin active region 100 near the trench 114 or groove is not damaged.

Figure 2H:
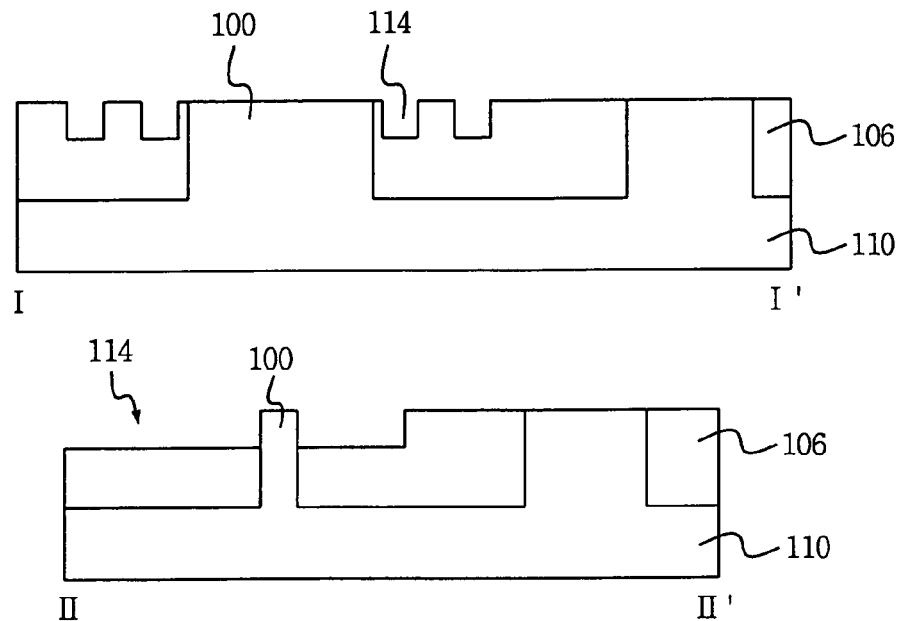

As shown in FIG. 2h, a first hard mask layer 104 and the silicon nitride layer formed on the fin active region 100 is removed by a wet or dry etching. For example, phosphoric acid solution or phosphoric acid reactive gas may be used, thus removing the first hard mask layer 104 and the liner layer.

Thus, in the inventive manufacturing method of a fin FET, a trench 114 or groove is formed by using first and second hard mask layers 108, and a sidewall of the fin active region 100 of the gate region G is selectively exposed, and the first and second hard mask layers 104 and 108 are removed to expose a top surface of the fin active region 100. In other words, a gate region G of the fin active region 100 can be exposed three-dimensionally.

Figure 2I:
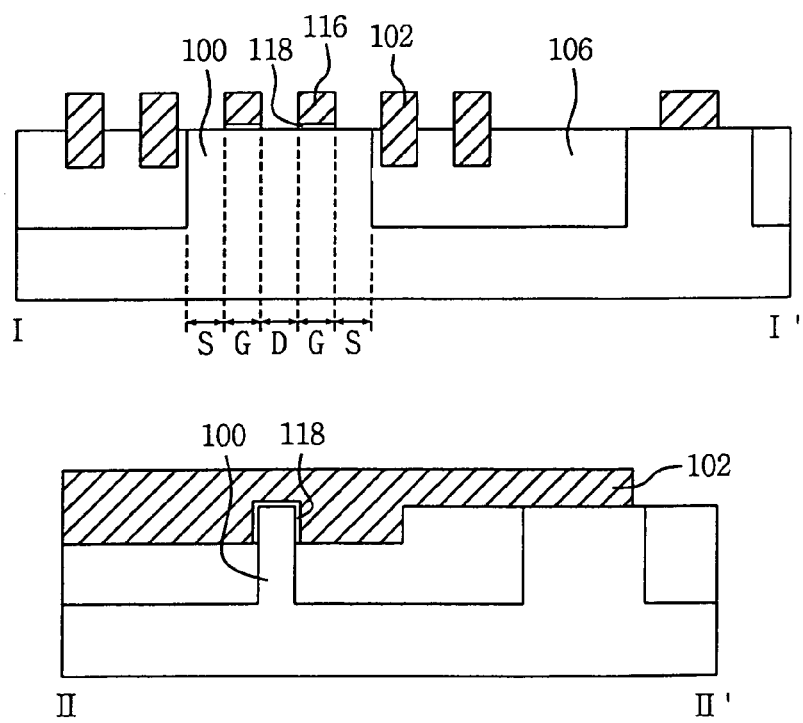

Referring to FIG. 2i, a gate insulation layer 118 is formed of silicon oxide, entirely on the fin active region 100, which is selectively exposed by the shallow trench insulator 106, by a thermal oxidation process. The gate insulation layer has a thickness under about 150 Å.

Polysilicon involving conductive impurity material or metal is formed entirely on the fin active region 100 where the gate insulation layer was formed, and on the shallow trench insulator 106 where a trench 114 or groove was formed. Then, the polysilicon or metal material is patterned by a general photolithography and etching method, thus forming a gate electrode 116.

Consequently, the fin active region 100 is connected to the bulk silicon substrate 110, and a gate voltage may be applied to the gate electrode 116 that surrounds three faces of the fin active region 100, so a channel forms in the fin active region 100. In this case, in the fin active region 100 of the three faces adjacent to the gate electrode 116, an electron-hole pair generated in a channel can be discharged to the bulk silicon substrate 110, thereby preventing, or substantially reducing, a floating body effect, thus increasing performance of the device.

Next, a conductive impurity is ion implanted into a source region S and a drain region D by using the gate electrode 116 as an ion implantation mask, thus forming a first impurity region. For example, the conductive impurity ion-implanted in the first impurity region may have a density of about $1 \times 10^{12}$ atoms/cm$^3$ to about $1 \times 10^{14}$ atoms/cm$^3$ with an energy under about 50 KeV. An insulation layer such as silicon oxide is formed entirely on the bulk silicon substrate 110, and is then removed anisotropically, thus forming a second spacer in a sidewall of the gate electrode 116. Further, conductive impurity is, again, ion implanted into the source/drain regions S and D by using the gate electrode 116 and the second spacer as an ion implantation mask, thus forming a second impurity region. The conductive impurity ion-implanted into the second impurity region is the same as or similar to the conductive impurity ion-implanted in the first impurity region, and is ion implanted with an energy under about 30 KeV and by a density of about $1 \times 10^{16}$ atoms/cm$^3$ to about $1 \times 10^{17}$ atoms/cm$^3$.

As described above, a fin FET, according to an exemplary embodiment of the invention, employs a bulk silicon substrate of which a manufacturing cost is lower than that of a conventional SOI type silicon substrate, thus increasing productivity.

A manufacturing method of a fin FET according to an exemplary embodiment has the following advantages.

Firstly, productivity increases, because the bulk silicon substrate has a manufacturing cost lower than that of a conventional SOI type silicon substrate.

Secondly, a floating body effect can be prevented, or is substantially reduced. This increases performance of the device, because a gate electrode surrounding three faces of a fin active region connected to a bulk silicon substrate is formed, and an electron-hole pair induced by a gate voltage applied to the gate electrode can be discharged to the bulk silicon substrate.

Thirdly, an increase of device performance exists because a height of the fin active region exposed by a shallow trench insulator can be controlled by using a time etching or EPD method.

Embodiments of the invention may be practiced in many ways. What follows are exemplary, non-limiting descriptions of some of these embodiments.

According to an embodiment of the invention, a method of manufacturing a fin FET includes forming a fin active region protruded along one direction from a bulk silicon substrate; entirely forming a shallow trench insulator on the bulk silicon substrate to cover the fin active region; removing the shallow trench insulator to selectively expose an upper part and sidewall of the fin active region, along a line shape that at least one time crosses the fin active region, thus forming a trench; and forming a gate insulation layer on the fin active region exposed by the trench, and thus forming a gate electrode.

According to another embodiment of the invention, a method of manufacturing a fin FET includes forming a first mask layer of a predetermined shape on a silicon substrate; etching by a predetermined depth the silicon substrate by using the first mask layer as an etch mask, and thus forming a fin active region protruded from the bulk silicon substrate; entirely forming a shallow trench insulator on the bulk silicon substrate to cover the fin active region, and planarizing the shallow trench insulator to expose the first mask layer; forming a second mask layer, where the second mask layer at least one time crosses the fin active region having one direction on the first mask layer and the shallow trench insulator, the second mask layer selectively exposing the first mask layer; forming a spacer in a sidewall of the second mask layer; removing by a predetermined depth the shallow trench insulator to expose a sidewall of the fin active region by using the spacer and the second mask layer as an etch mask, and removing the spacer, and the first and second mask layers; forming a gate insulation layer on a gate region of the fin active region exposed by the shallow trench insulator, and thus forming a gate electrode; and ion implanting a conductive impurity in source/drain regions of the fin active region exposed by the gate electrode, and thus forming an impurity region.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

We claim:

1. A method of manufacturing a fin field effect transistor (fin FET), the method comprising:

covering a bulk silicon substrate with a first hard mask layer;

patterning the first hard mask layer such that a first portion of the bulk silicon substrate is exposed and a second portion of the bulk silicon substrate remains covered by the first hard mask layer;

removing a part of the first portion of the bulk silicon substrate such that the second portion of the bulk silicon substrate forms a fin active region that protrudes along one direction from a remaining part of the first portion of the bulk silicon substrate;

covering the fin active region with a shallow trench insulator formed on the bulk silicon substrate;

removing the shallow trench insulator to form a trench that exposes an upper surface and a sidewall of the fin active region, the trench crossing the fin active region at least one time, wherein removing the shallow trench insulator comprises:

depositing a second hard mask layer on the shallow trench insulator and patterning the second hard mask layer;

depositing a spacer on a sidewall of the patterned second hard mask layer; and removing the shallow trench insulator to a predetermined depth using the spacer and the second hard mask layer as an etch mask; and depositing a gate insulation layer on the fin active region exposed by the trench to form a gate electrode.

2. The method of claim 1, wherein the upper surface of the fin active region is disposed parallel to and at a predetermined distance from an upper surface of the remaining part of the first portion of the bulk silicon substrate.

3. The method of claim 1, wherein forming the fin active region comprises etching the bulk silicon substrate by a time etching method.

4. The method of claim 1, wherein the fin active region has a height over about 1500Å.

5. The method of claim 1, further comprising forming a liner layer made of a silicon oxide and a silicon nitride on a surface of the bulk silicon substrate and in a sidewall of the fin active region.

6. The method of claim 1, wherein covering the fin active region with the shallow trench insulator comprises covering the fin active region with a silicon oxide layer.

7. The method of claim 6, wherein covering the fin active region with the silicon oxide layer comprises:

depositing the silicon oxide layer on the bulk silicon substrate where the fin active region is disposed; and removing and planarizing the silicon oxide layer to expose the first hard mask layer.

8. The method of claim 7, wherein planarizing the shallow trench insulator comprises chemically-mechanically polishing the shallow trench insulator.

9. The method of claim 1, wherein depositing the second hard mask layer consists of depositing a polysilicon layer and wherein depositing the spacer consists of depositing a silicon nitride layer.

10. The method of claim 1, wherein depositing the second hard mask layer consists of depositing a silicon nitride layer and wherein depositing the spacer consists of depositing a polysilicon layer.

11. The method of claim 1, wherein removing the shallow trench insulator comprises removing the shallow trench insulator to a depth of about 300 Å to about 800 Å from a top surface of the fin active region.

12. The method of claim 1, wherein removing the shallow trench insulator is performed by using a time etching method.

13. The method of claim 1, wherein removing the shallow trench insulator comprises etching the shallow trench insulator simultaneously with the second hard mask layer so that an etching of the shallow trench insulator is completed at a time when a surface of the first hard mask layer under the second hard mask layer or the shallow trench insulator is exposed, thus completing an etch point detection.

14. The method of claim 1, wherein removing the shallow trench insulator further comprises removing the first hard mask layer.

15. The method of claim 14, wherein removing the first hard mask layer comprises removing the first hard mask layer with a solution or a reactive gas.

16. The method of claim 15, wherein the reactive gas includes phosphoric acid.

17. A method of manufacturing a fin FET, comprising:
forming a first mask layer of a predetermined shape on a bulk silicon substrate;
etching, to a predetermined depth, the bulk silicon substrate by using the first mask layer as an etch mask, to form a fin active region that protrudes from the bulk silicon substrate;
covering the tin active region by forming a shallow trench insulator on the bulk silicon substrate;
planarizing the shallow trench insulator to expose the first mask layer;
forming a second mask layer that at least one time crosses the fin active region, where the second mask layer selectively exposes the first mask layer;
forming a spacer on a sidewall of the second mask layer;
removing, by a predetermined depth, the shallow trench insulator to expose a sidewall of the fin active region by using the spacer and the second mask layer as an etch mask;
removing the spacer and the first and second mask layers;
forming a gate insulation layer on a gate region of the fin active region exposed by the shallow trench insulator to form a gate electrode; and
ion implanting a conductive impurity in source/drain regions of the fin active region exposed by the gate electrode to form an impurity region.

18. A method of manufacturing a fin field effect transistor (fin FET), the method comprising:
forming a first hard mask layer on a bulk silicon substrate;
patterning the first hard mask layer to expose a portion of the bulk silicon substrate;
removing the portion of the bulk silicon substrate to form a fin active region that protrudes along one direction from the bulk silicon substrate;
covering the fin active region with a shallow trench insulator formed on the bulk silicon substrate;
depositing a second hard mask layer on the shallow trench insulator;
patterning the second hard mask layer;
depositing a spacer on a sidewall of the patterned second hard mask layer; and
removing the shallow trench insulator to a predetermined depth using the spacer and the second hard mask layer as an etch mask to form a trench that selectively exposes an upper part and a sidewall of the fin active region, the trench crossing the fin active region at least one time; and
depositing a gate insulation layer on the fin active region exposed by the trench to form a gate electrode.

19. The method of claim 18, wherein depositing the second hard mask layer consists of depositing a polysilicon layer and wherein depositing the spacer consists of depositing a silicon nitride layer.

20. The method of claim 18, wherein depositing the second hard mask layer consists of depositing a silicon nitride layer and wherein depositing the spacer consists of depositing a polysilicon layer.

21. The method of claim 18, wherein removing the shallow trench insulator comprises removing the shallow trench insulator to a depth of about 300 Å to about 800 Å from a top surface of the fin active region.

22. The method of claim 18, wherein removing the shallow trench insulator is performed by using a time etching method.

23. The method of claim 18, wherein removing the shallow trench insulator comprises etching the shallow trench insulator simultaneously with the second hard mask layer so that an etching of the shallow trench insulator is completed at a time when a surface of the first hard mask layer under the second hard mask layer or the shallow trench insulator is exposed, thus completing an etch point detection.

24. The method of claim 18, wherein removing the shallow trench insulator further comprises removing the first hard mask layer.

25. The method of claim 24, wherein removing the first hard mask layer removing the first hard mask layer with a solution or a reactive gas.

26. The method of claim 25, wherein the reactive gas includes phosphoric acid.

* * * * *

UNITED STATES PATENT AND TRADEMARK OFFICE
CERTIFICATE OF CORRECTION

| | | |
|---|---|---|
| PATENT NO. | : 7,160,780 B2 | Page 1 of 1 |
| APPLICATION NO. | : 11/066703 | |
| DATED | : January 9, 2007 | |
| INVENTOR(S) | : Chul Lee et al. | |

It is certified that error appears in the above-identified patent and that said Letters Patent is hereby corrected as shown below:

Column 9, line 23, the word "tin" should read -- fin --.

Signed and Sealed this

Fourteenth Day of October, 2008

JON W. DUDAS
*Director of the United States Patent and Trademark Office*